(12) United States Patent
Benetik et al.

(10) Patent No.: US 7,388,734 B2
(45) Date of Patent: Jun. 17, 2008

(54) INTEGRATED CIRCIUT ARRANGEMENT

(75) Inventors: Thomas Benetik, Munich (DE); Uwe Hodel, Munich (DE); Christoph Kienmayer, Unterhaching (DE); Martin Streibl, Petershausen (DE); Marc Tiebout, Munich (DE)

(73) Assignee: Infineon Technologies AG (DE)

( * ) Notice: Subject to any disclaimer, the term of this patent is extended or adjusted under 35 U.S.C. 154(b) by 20 days.

(21) Appl. No.: 11/264,294

(22) Filed: Oct. 31, 2005

(65) Prior Publication Data
US 2006/0103995 A1 May 18, 2006

(30) Foreign Application Priority Data
Nov. 2, 2004 (DE) ........................ 10 2004 052 868

(51) Int. Cl.
*H02H 9/00* (2006.01)

(52) U.S. Cl. ............................................ 361/56
(58) Field of Classification Search ................. 361/56, 361/119
See application file for complete search history.

(56) References Cited

U.S. PATENT DOCUMENTS

| | | | | |
|---|---|---|---|---|
| 5,596,474 A | * | 1/1997 | Wada et al. | 361/111 |
| 5,625,280 A | * | 4/1997 | Voldman | 323/284 |
| 5,654,574 A | * | 8/1997 | Williams et al. | 257/355 |
| 5,995,353 A | * | 11/1999 | Cunningham et al. | 361/111 |
| 6,507,471 B2 | * | 1/2003 | Colclaser et al. | 361/111 |
| 6,665,527 B2 | * | 12/2003 | Schiltz | 455/326 |
| 7,113,050 B1 | * | 9/2006 | Lindgren | 331/117 FE |
| 2003/0231446 A1 | * | 12/2003 | Leete | 361/56 |

FOREIGN PATENT DOCUMENTS

DE 102 39 230 A1 7/2003

OTHER PUBLICATIONS

Ming-Dou Ker et al.; "ESD Protection Design for Giga-Hz RF CMOS LNA with Novel Impedance-Isolation Technique"; EOS/ESD Symposium Proceedings 2003, pp. 204-213.
V. Vassilev et al.; "Co-Design Methodology to Provide High ESD Protection Levels in the Advanced RF Circuits"; EOS/ESD Symposium Proceedings 2003, pp. 195-203.

(Continued)

*Primary Examiner*—Michael J Sherry
*Assistant Examiner*—Scott Bauer
(74) *Attorney, Agent, or Firm*—Dickstein, Shapiro, LLP.

(57) ABSTRACT

Integrated circuit arrangement having first and second signal input pads, to which a differential input signal is applied, and first and second signal outputs, at which a differential output signal is provided. The first signal output is coupled to the first signal input pad and the second signal output is coupled to the second signal input pad. A first capacitance is between the first and second signal input pads. First and second inductances are connected in series, are between the first and second signal input pads, and are connected in parallel with the first capacitance. A first terminal is at a first supply potential and a second terminal is at a second supply potential. A first electrostatic discharge element is between the first and second terminals. A second electrostatic discharge element is between the first terminal, on the one hand, and the first and second inductances, on the other hand.

25 Claims, 5 Drawing Sheets

OTHER PUBLICATIONS

Sami Hyvonen et al.; "Comprehensive ESD Protection for RF Inputs"; EOS/ESD Symposium Proceedings 2003, pp. 188-194.

Sherif Galal et al.; "Broadband ESD Protection Circuits in CMOS Technology"; Proceedings ISSCC 2003, Session 10, High Speed Building Blocks, Paper 10.5.

P. Leroux et al.; "High-Performance 5.2$GH_z$ LNA with on-chip inductor to provide ESD protection"; IEE Electronices Letters, vol. 37, No. 7, Mar. 2001, pp. 467-469.

P. Leroux et al; "A 0.8dB NF ESD-protected 9mW CMOS LNA"; ISSCC Dig. Tech. Papers, vol. 26, 2001.

Shahram Mahdavi et al.; "Fully Integrated 2.2-mW CMOS Front End for a 900-MHz Wireless Receiver"; IEEE Journal of Solid-State Circuits, vol. 37, No. 5, May 2002.

Thomas Liebermann et al.; "A Low Phasenoise, Differentially Tuned, 1.8TGHz Power VCO with an ESD-compatible 14dBM Output Stage in Standard Digital CMOS"; ESSCIRC Proceedings, Villach, Sep. 2001.

* cited by examiner

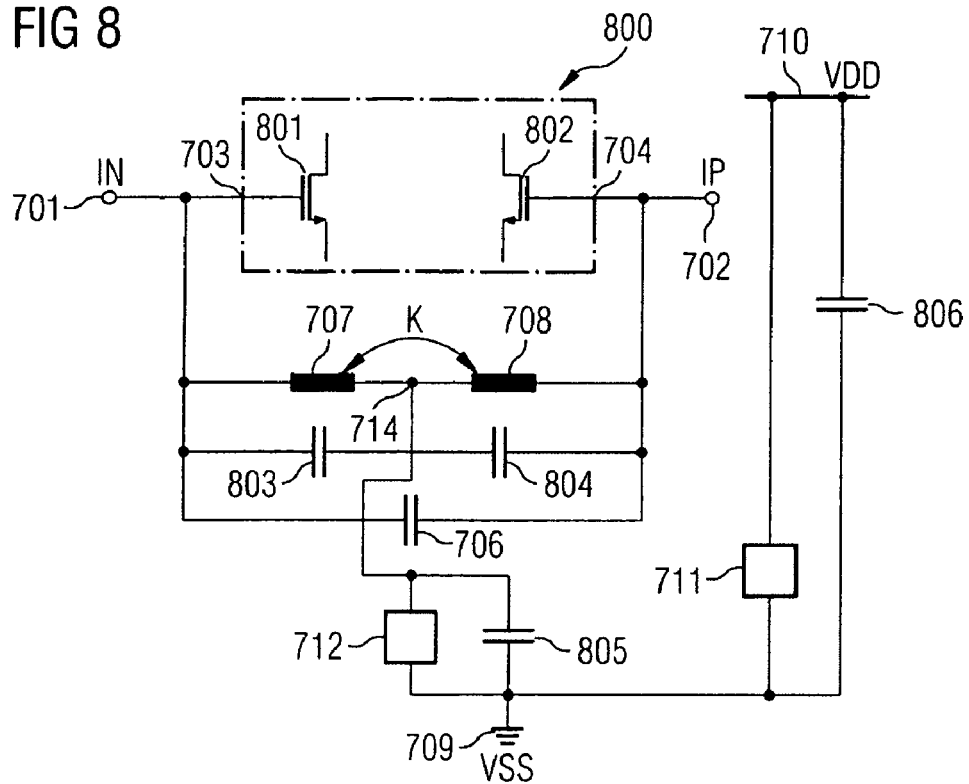
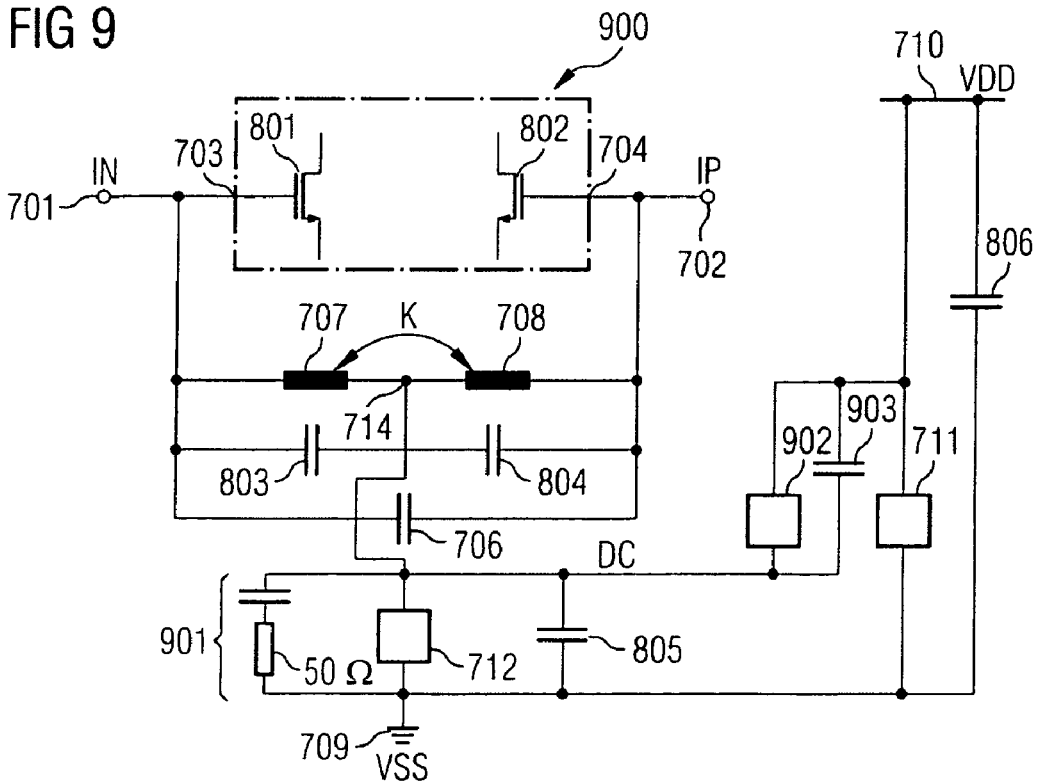

INTEGRATED CIRCIUT ARRANGEMENT

CROSS-REFERENCE TO RELATED APPLICATION

This application claims priority to German Patent Application Serial No. 10 2004 052 868.3, which was filed on Nov. 2, 2004 and is incorporated herein by reference in its entirety.

FIELD OF THE INVENTION

The invention relates to an integrated circuit arrangement and a circuit array.

BACKGROUND OF THE INVENTION

"Electrostatic Discharge" (ESD) describes the processes and effects when electrical charges are equalized between two differently charged components. If the latter come into contact with one another, positive and negative charges are exchanged, and this may give rise to damage in an electrical circuit.

In an integrated circuit, an upper operating potential $V_{DD}$ and lower operating potential $V_{SS}$ are provided, between which provision is made of protection mechanisms for avoiding damage on account of ESD.

ESD, that is to say electrostatic discharges, are often the cause of damage to or destruction of an integrated circuit and thus cause high financial damage. The development of MOS technology (metal oxide semiconductor) in microelectronics has been accompanied by a miniaturization of the semiconductor components at increasingly high clock rates. This results in a rising sensitivity towards ESD pulses, that is to say high voltage and current spikes of such clock signals. Semiconductor components under ESD stress can cause errors in an integrated circuit. ESD can lead to a total failure of or damage to the component. Therefore, protection against electrostatic discharges (ESD protection) is important nowadays in all areas of microelectronics.

ESD protection in radiofrequency circuitry applications is a difficult technical problem, since the high parasitic capacitance of ESD protection elements inherently greatly restricts the maximum operating frequency that can be achieved for the circuit. Such ESD protection elements are, for example, a diode, a thyristor or a grounded n-MOS component (that is to say an n-MOS field effect transistor with a gate terminal at the electrical ground potential). Smaller ESD protection elements would enable higher frequencies, but do not sufficiently satisfy the functionality as ESD protection, that is to say are not sufficiently able to dissipate ESD currents.

A description is given below, referring to FIG. 1, of a circuit arrangement 100 with ESD protection in accordance with the prior art.

In the case of the circuit arrangement 100, an input signal can be provided at a signal input pad 101 and be fed to an input/output circuit 102. In order to supply the circuit arrangement 100 with electrical energy, a supply potential 103 $V_{DD}$ is provided, and an electrical ground potential 104 GND. A first ESD protection element 105 is provided between the signal input pad 101 and the supply potential 103 $V_{DD}$. Furthermore, a second ESD protection element 106 is provided between the signal input pad 101 and the electrical ground potential 104.

Furthermore, FIG. 1 shows a circuit arrangement 110, which has, in addition to the components of the circuit arrangement 100, a nonreactive resistor 111 between the signal input pad 101 and the input/output circuit 102.

FIG. 1 clearly shows circuit arrangements 100, 110 having protection against high voltages through the provision of the ESD protection elements 105, 106, since the latter electrically decouple the supply potential 103 $V_{DD}$ from the ground potential 104 GND.

In the case of a large electric current intensity, the ESD elements 105, 106 have to be sufficiently large. In radiofrequency applications, however, large ESD elements lead to an undesirable large parasitic capacitance.

Approaches for ESD protection circuit arrangements for radiofrequency circuits are disclosed in (1) Ming-Dou Ker at al., EOS/ESD-Symp. Proceedings 2003, pages 204-213, (2) Vassilev, V et al., EOS/ESD-Symp. Proceedings 2003, pages 195-203, (3) Hyvonen et al., EOS/ESD-Symp. Proceedings 2003, pages 188-194, (4) Galai, S, Razavi, B "Broadband ESD Protection Circuits in CMOS-Technology", Proceedings ISSCC 2003, Paper 10.5, (5) Leroux, P, Steyaert, M "A high performance 5.2 GHz LNA with an on-chip inductor to provide EDS-protection", IEE Electronics Letters, Volume 37, No. 1, pages 467-469, March 2001, (6) Leroux, P, Janssens, J, Steyaert, M "A 0.8 dB NF ESD-protected 9 mW CMOS LNA", ISSCC Dig. Tech. Papers, Volume 26, pages 410-411, 2001, (7) Mahdavi, S, Abidi, A "Fully integrated 2.2-mW CMOS Front End for a 900-MHz Wireless Receiver", IEEE JSSC, 05/2002, and (8) Liebermann, T, Tiebout, M "A Low Phasenoise, Differentially Tuned, 1.8 GHz Power VCO with an ESD-compatible 14 dBm Output Stage in Standard Digital CMOS", ESSCIRC Proceedings, Villach, 09/2001.

The approach disclosed in Leroux, P, Steyaert, M "A high performance 5.2 GHz LNA with an on-chip inductor to provide EDS-protection", IEE Electronics Letters, Volume 37, No. 1, pages 467-469, March 2001, Leroux, P, Janssens, J, Steyaert, M "A 0.8 dB NF ESD-protected 9 mW CMOS LNA", ISSCC Dig. Tech. Papers, Volume 26, pages 410-411, 2001, and Mahdavi, S, Abidi, A "Fully integrated 2.2-mW CMOS Front End for a 900-MHz Wireless Receiver", IEEE JSSC, 05/2002, essentially consists in using smaller ESD protection elements.

FIG. 2 shows an ESD protection circuit 200 such as is disclosed in Mahdavi, S, Abidi, A "Fully integrated 2.2-mW CMOS Front End for a 900-MHz Wireless Receiver", IEEE JSSC, 05/2002.

FIG. 3 shows an ESD protection circuit arrangement 300 disclosed in Leroux, P, Janssens, J, Steyaert, M "A 0.8 dB NF ESD-protected 9 mW CMOS LNA", ISSCC Dig. Tech. Papers, Volume 26, pages 410-411, 2001, in the case of which arrangement the ESD protection is realized by means of a first ESD protection diode 201 and by means of a second ESD protection diode 302.

The approaches in accordance with Leroux, P, Steyaert, M "A high performance 5.2 GHz LNA with an on-chip inductor to provide EDS-protection", IEE Electronics Letters, Volume 37, No. 1, pages 467-469, March 2001, Leroux, P, Janssens, J, Steyaert, M "A 0.8 dB NF ESD-protected 9 mW CMOS LNA", ISSCC Dig. Tech. Papers, Volume 26, pages 410-411, 2001, and Mahdavi, S, Abidi, A "Fully integrated 2.2-mW CMOS Front End for a 900-MHz Wireless Receiver", IEEE JSSC, 05/2002, have the disadvantage, however, that they usually have only low ESD strength, and that the range of processable radio frequencies with which the circuit arrangements can be operated is restricted. At higher frequencies such as 5 GHz or 17 GHz such as are used for WLAN systems ("wireless local area network") these approaches are thus only poorly suitable or no longer suitable at all.

An alternative approach in accordance with Ming-Dou Ker at al., EOS/ESD-Symp. Proceedings 2003, pages 204-213, Vassilev, V et al., EOS/ESD-Symp. Proceedings 2003, pages 195-203, Hyvonen et al., EOS/ESD-Symp. Proceedings 2003, pages 188-194, and Galai, S, Razavi, B "Broadband ESD Protection Circuits in CMOS-Technology", Proceedings ISSCC 2003, Paper 10.5essentially consists in decoupling the ESD protection elements using LC resonant circuits realized on-chip, or in tuning the capacitance of each ESD element in an LC resonant circuit.

The ESD protection circuit arrangement 400 shown in FIG. 4 represents a solution such as is disclosed in Galai, S, Razavi, B "Broadband ESD Protection Circuits in CMOS-Technology", Proceedings ISSCC 2003, Paper 10.5. The ESD protection circuit arrangement 400 is provided with a first ESD protection subcircuit 401 and a second ESD protection subcircuit 402, an ESD capacitance 403 representing a (parasitic) capacitance of the ESD protection elements 401, 402.

What is disadvantageous about the approach in accordance with Ming-Dou Ker at al., EOS/ESD-Symp. Proceedings 2003, pages 204-213, Vassilev, V et al., EOS/ESD-Symp. Proceedings 2003, pages 195-203, Hyvonen et al., EOS/ESD-Symp. Proceedings 2003, pages 188-194, and Galai, S, Razavi, B "Broadband ESD Protection Circuits in CMOS-Technologyis the high area requirement of the integrated inductances.

In the case of the ESD protection circuit arrangement 500 disclosed in Liebermann, T, Tiebout, M "A Low Phasenoise, Differentially Tuned, 1.8 GHz Power VCO with an ESD-compatible 14 dBm Output Stage in Standard Digital CMOS", ESSCIRC Proceedings, Villach, 09/2001, which is shown in FIG. 5, an inductance is used instead of traditional ESD protection elements. ESD protection is clearly achieved by means of the standard ESD protection elements coupled to the supply voltage.

Consequently, the ESD protection circuit arrangement 500 is provided with a first inductance 501 and a second inductance 502, but also a capacitance 503. Furthermore, a plurality of signal inputs 101 and a plurality of signal outputs 102 are provided.

The problem of effective ESD protection is particularly pronounced in the context of a differential circuit in the case of an ESD discharge between two differential radiofrequency input/output pins (RF I/O pins). Conventional ESD protection of the radiofrequency input/output pins against local supply potentials leads to particularly high voltage drops across an ESD protection path.

A description is given below, referring to FIG. 6, of a circuit arrangement 600 in accordance with the prior art, which reveals the particular jeopardization of a differential RF input circuit in the case of one ESD discharge between two differential RF pins (IN and IP).

The circuit arrangement 600 contains a first signal input pad 601 (IN) and a second signal input pad 602 (IP) between which a differential input signal can be provided. A differential output signal can be provided between a first signal output 603 (ON) and a second signal output signal 604 (OP). The first signal input pad 601 is coupled to the gate region of a first n-MOS field effect transistor 605, the first source/drain region of which is coupled to a current source 607 and the second source/drain region of which is coupled to the first signal output 603. The second signal input pad 602 is coupled to the gate region of a second n-MOS field effect transistor 606, the first source/drain region of which is coupled to the current source 607 and the second source/drain region of which is coupled to the second signal output 604. A second terminal of the current source 607 is brought to the ground potential 104 $V_{SS}$. Three ESD protection paths are formed between the supply potential 103 $V_{DD}$ and the ground potential 104 $V_{SS}$. A first ESD protection path comprises a first ESD protection diode 608 and a second ESD protection diode 609. A second ESD protection path comprises a third ESD protection diode 610 and a fourth ESD protection diode 611. A third ESD protection path comprises an ESD protection element 612, which may be a thyristor for example. As shown by way of example in FIG. 6, in the event of a positive discharge from the RF input pin IN 601 with respect to the second RF input pin IP 602, the ESD current is passed via three protection elements in series (protection diodes 608, 609 at IN, protection element 612 between $V_{DD}$ and $V_{SS}$, protection diodes 610, 611 at IP). The high voltage drop arising in this case may lead to the breakdown of the two gate insulating layers of the input transistors 605, 606, that is to say to an undesirable current flow between the gate regions of the transistors 605, 606, and may thus destroy the circuit arrangement 600. Conventionally, this problem can only be combated by inserting additional protection elements, which would degrade the performance of the circuit on account of the additional capacitance per unit length.

DE 102 39 230 A1 discloses a radiofrequency semiconductor device in which an ESD protection circuit is connected to a node forming a branch junction of a radiofrequency signal input/output line, one end of the radiofrequency signal input/output line being connected to a radiofrequency input/output pad, the other end of the radiofrequency input/output line being connected to an internal circuit, and a DC blocking capacitor being connected in series between the node and the internal circuit.

SUMMARY OF THE INVENTION

An integrated circuit arrangement having a first signal input pad and a second signal input pad, to which a differential input signal can be applied. The arrangement also has at least one signal output, at which an output signal can be provided, the signal output being coupled to the first signal input pad and to the second signal input pad. A first capacitance is arranged between the first signal input pad and the second signal input pad. A first inductance and a second inductance are connected in series with the first inductance, which inductances are arranged between the first signal input pad and the second signal input pad and are connected in parallel with the first capacitance. A first terminal has a first supply potential, and a second terminal has a second supply potential. A first electrostatic discharge element is arranged between the first terminal and the second terminal. A second electrostatic discharge element is arranged between the first terminal, on the one hand, and the first and second inductances, on the other hand.

BRIEF DESCRIPTION OF THE DRAWINGS

Exemplary embodiments of the invention are illustrated in the figures and are explained in more detail below.

FIG. 8 shows an ESD protection circuit arrangement in accordance with a second exemplary embodiment of the invention; and FIG. 9 shows an ESD protection circuit arrangement in accordance with a third exemplary embodiment of the invention.

Identical or similar components in different figures are provided with identical reference numerals.

Figure 1:
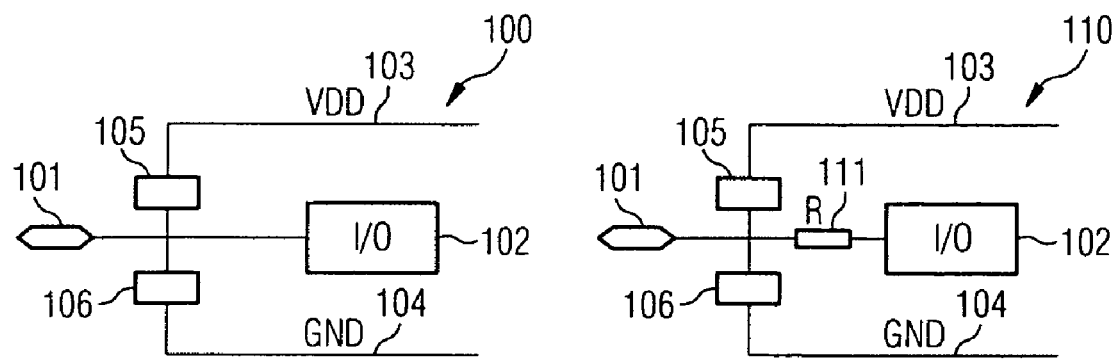
FIG. 1 shows a first ESD protection circuit arrangement in accordance with the prior art.
Figure 2:
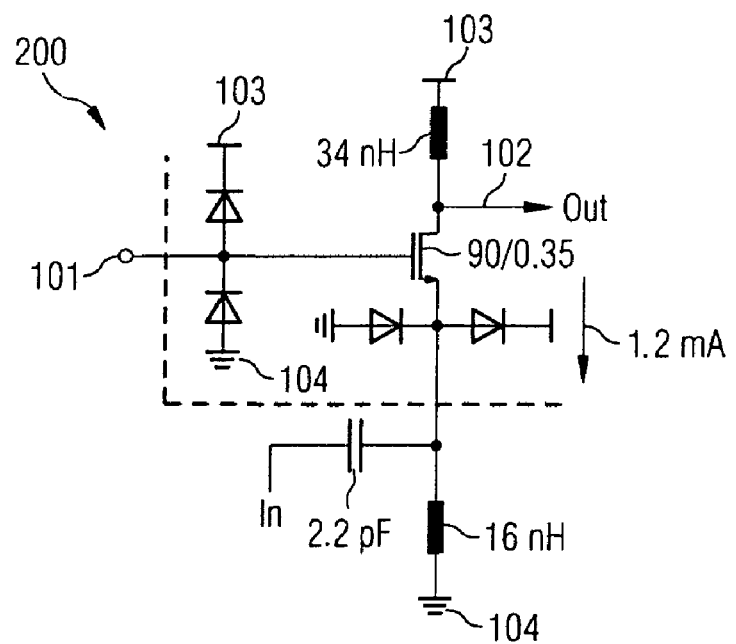
FIG. 2 shows a seconds ESD protection circuit arrangement in accordance with the prior art.
Figure 3:
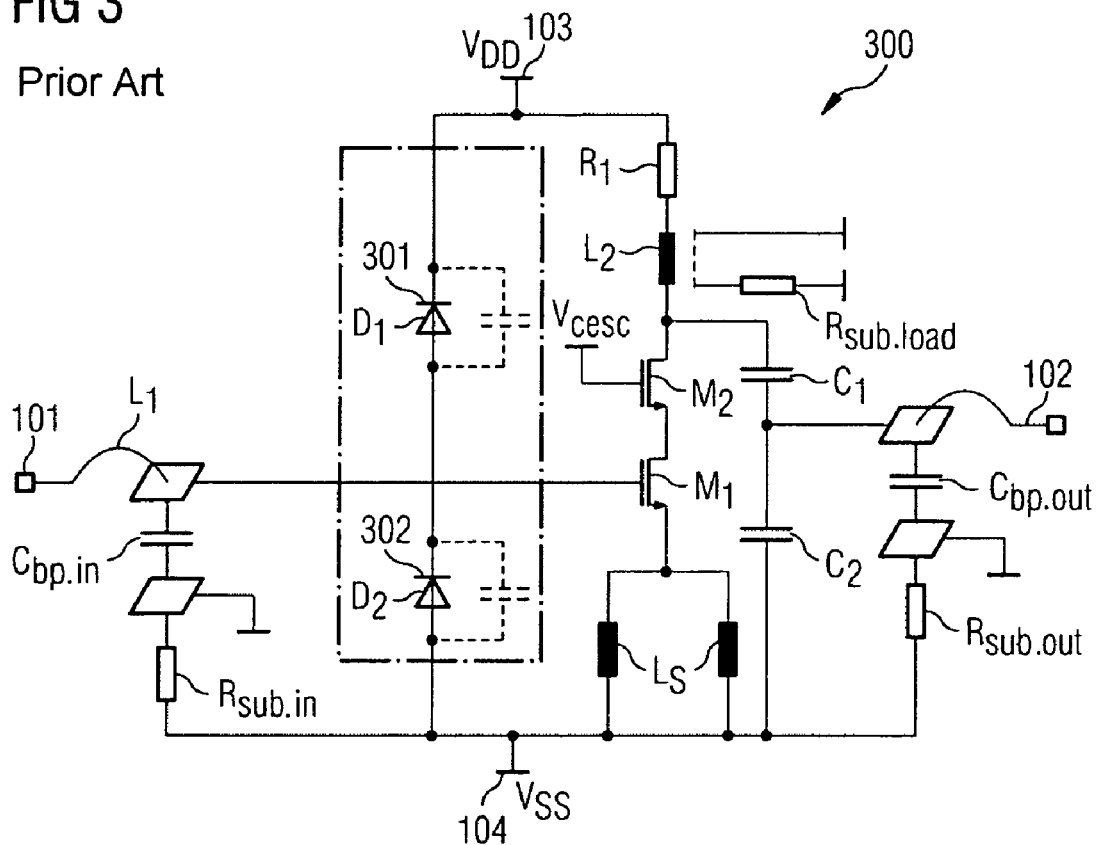
FIG. 3 shows a third ESD protection circuit arrangement in accordance with the prior art.
Figure 5:
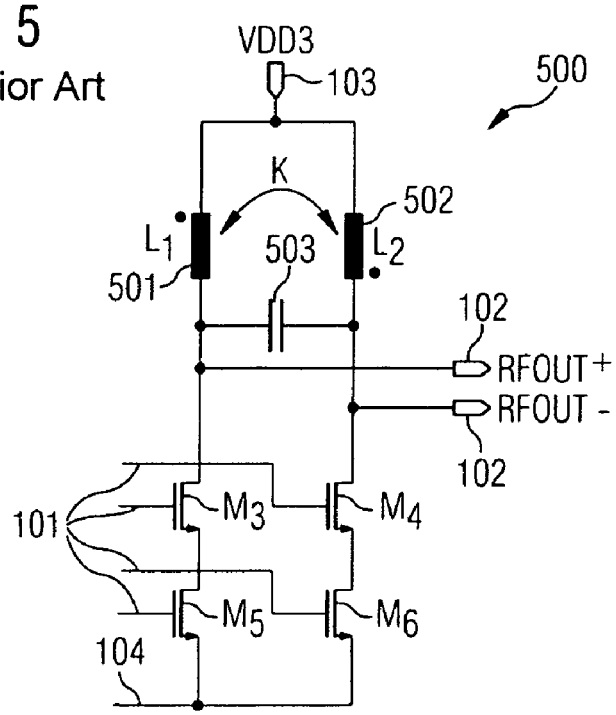
FIG. 5 shows a fifth ESD protection circuit arrangement in accordance with the prior art.
Figure 4:
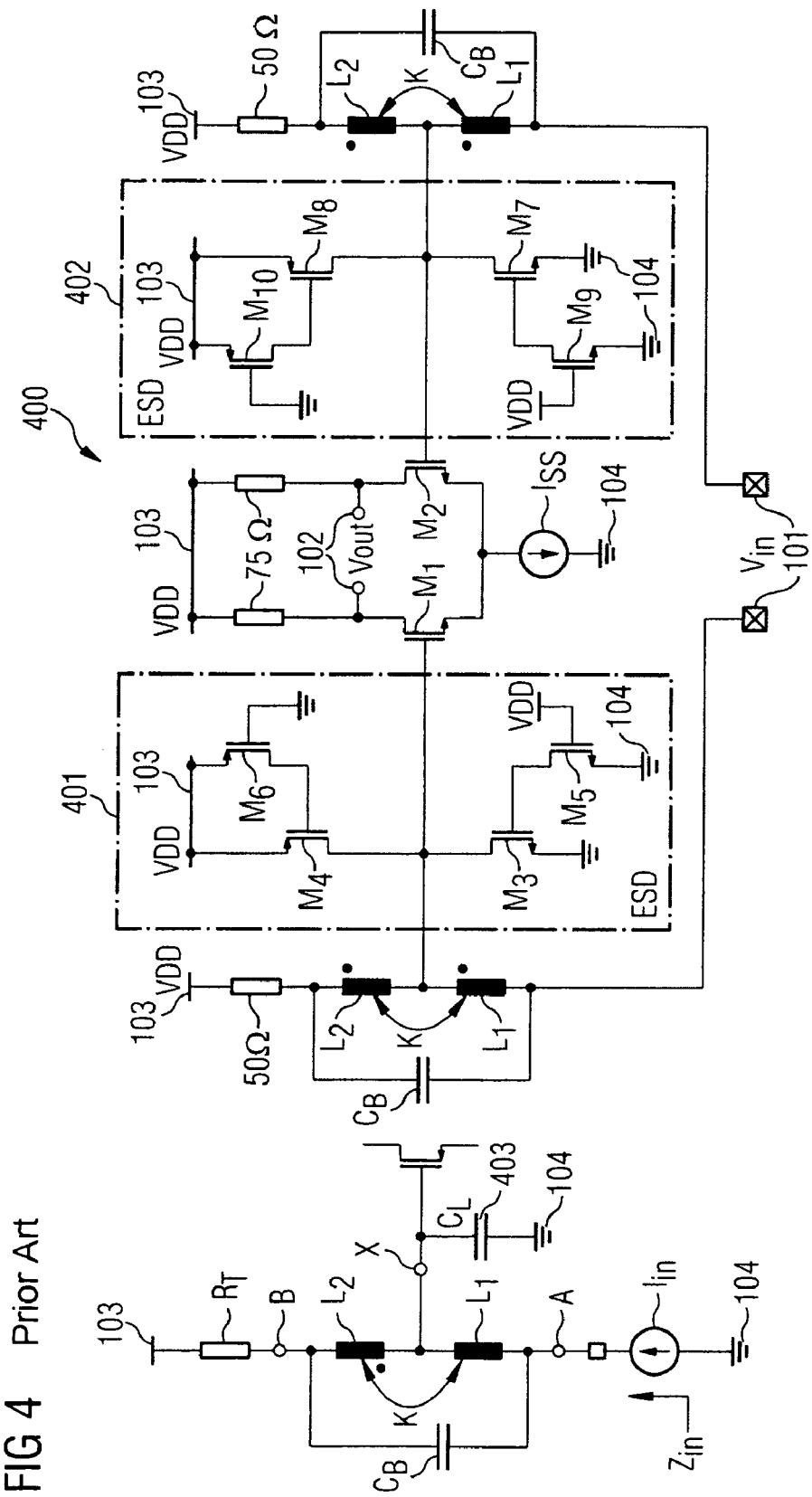
FIG. 4 shows a fourth ESD protection circuit arrangement in accordance with the prior art.
Figure 6:
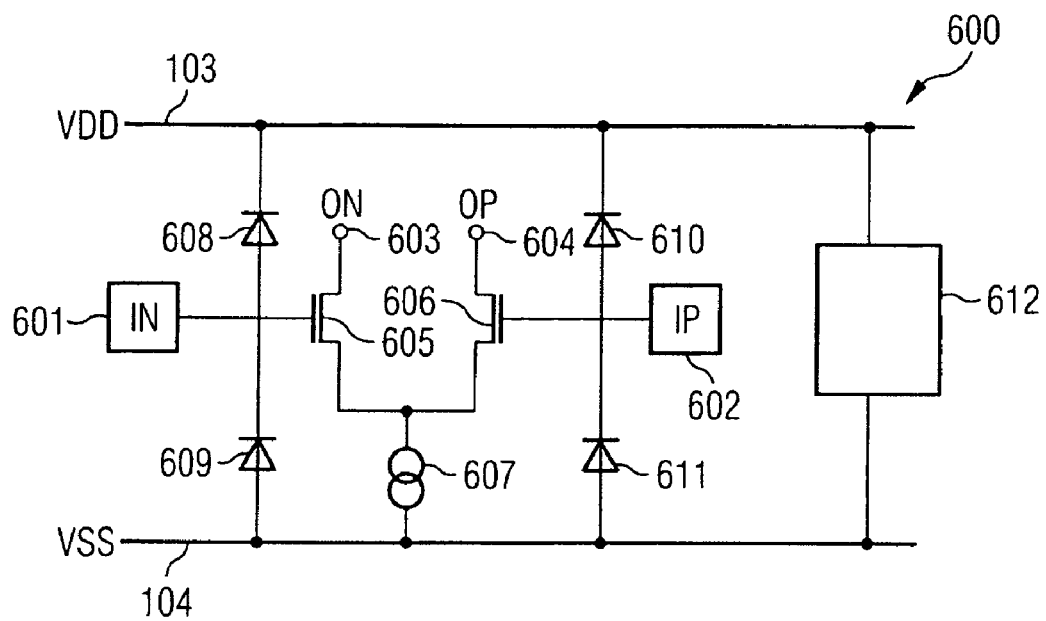
FIG. 6 shows a sixth ESD protection circuit arrangement in accordance with the prior art.

The illustrations in the figures are schematic and not to scale.

DETAILED DESCRIPTION OF PREFERRED EMBODIMENTS OF THE INVENTION

The invention is based on the problem of providing a circuit arrangement which enables a reliable ESD protection even for differential radiofrequency applications.

This problem is solved by means of a circuit arrangement and by means of a circuit array.

The integrated circuit arrangement according to the invention contains a first signal input pad and a second signal input pad, at which a differential input signal is present. Furthermore, a signal output, which preferably has a first signal output terminal and a second signal output terminal, is provided, at which a, preferably differential, output signal can be provided, the signal output being coupled to the first signal input pad and to the second signal input pad. Furthermore, the integrated circuit arrangement contains a first capacitance between the first signal input pad and the second signal input pad, and a first inductance and a second inductance connected in series with the first inductance, which inductances are arranged between the first signal input pad and the second signal input pad and are connected in parallel with the first capacitance. Moreover, the integrated circuit arrangement has a first terminal, which can be brought to a first supply potential, and has a second terminal, which can be brought to a second supply potential. A first electrostatic discharge element is provided between the first terminal and the second terminal. Moreover, a second electrostatic discharge element is connected between the first terminal, on the one hand, and the first and second inductances, on the other hand.

Furthermore, the invention provides a circuit array having an integrated circuit arrangement having the features described above and having a useful circuit coupled to the integrated circuit arrangement.

One basic idea of the invention can be seen in the fact that, for a monolithically integrated circuit arrangement for processing a differential input signal, an effective ESD protection is provided by skilfully connecting up two coils that are preferably coupled to form a coupling inductance, so that clearly an RF-free node is formed between the coils. Proceeding from this RF-free node lead terminals to the upper and lower supply potentials, which are protected against ESD damage by means of the first electrostatic discharge element and by means of the second electrostatic discharge element, respectively. By means of this novel and unusual ESD circuit architecture, even radiofrequency circuits with differential signal processing are reliably protected against ESD damage, a large capacitive loading simultaneously being avoided.

Clearly, the invention creates a differential RF input ESD protection by means of providing a novel protection circuit for the ESD protection of differential RF input circuits against electrostatic discharges, in particular between two signal input pads (RF pins).

The ESD protection concept of the invention can advantageously be used in differential radiofrequency input circuits (RF input circuits) which operate at a specific operating frequency or in a specific frequency band (band pass). Two input pins are connected up to one another by coils, which are preferably functionally coupled (for example describable by a coupling factor k for forming a coupling inductance, "mutual inductance"). Given a suitable design of the values of the two inductances and at least one capacitance, the two RF input pins remain insulated from one another at the operating frequency with regard to a radiofrequency signal (that is to say in RF terms).

In addition, by means of the coupling of the two RF input pads, it is possible to provide a center node which is RF-free on account of the differential function of the input circuit and to which additional ESD protection elements can be connected with respect to a ground terminal or with respect to a positive supply potential without a harmful effect. In this case, the coil path between the two differential RF input pins undertakes the ESD protection in the case of ESD loading between the two input pins, and the ESD protection element at the center node undertakes the protection in the case of the loading of one of the two input pins toward ground or toward the positive supply voltage. On account of the small dimensions of the passive components, this novel protection concept is suitable primarily for circuits having a high operating frequency, in particular in the range >5 GHz. By means of connecting up additional RF matching elements at the center node, such as, for example, a capacitance and an RC element (series circuit comprising a nonreactive resistor and a capacitor), it is possible to set the impedance matching of the protection circuit without degrading the protective effect of the circuit in the process.

The first supply potential may be an upper operating potential (for example an operating potential $V_{DD}$), and the second supply potential may be a lower operating potential (for example the electrical ground potential $V_{SS}$).

As an alternative, the first supply potential may be a lower operating potential (for example the electrical ground potential $V_{SS}$), and the second supply potential may be an upper operating potential (for example $V_{DD}$).

At least one of the electrostatic discharge elements may be realized as a diode. Furthermore, each electrostatic discharge element may also be formed from a plurality of components, for example from a plurality of diodes.

At least one of the electrostatic discharge elements may alternatively or supplementarily have a thyristor (or a plurality of thyristors).

At least one of the electrostatic discharge elements may alternatively or supplementarily have one or a plurality of field effect transistors. The field effect transistor may be a so-called grounded n-MOS field effect transistor. In the case of a grounded n-MOS field effect transistor, the gate terminal is grounded, that is to say it is brought to the electrical ground potential.

Clearly, ESD protection elements known per se can advantageously be combined with the novel architecture of the circuit arrangement according to the invention, resulting in a small area requirement of the circuit arrangement.

The differential input signal that can be applied to the first signal input pad and to the second signal input pad may be a radiofrequency signal. The integrated circuit arrangement is outstandingly suitable in particular for processing radiofrequency signals and represents a skilful solution to the difficult technical problem of implementing ESD protection in radiofrequency applications.

The circuit arrangement according to the invention may be provided with a radiofrequency processing circuit connected to the first signal output and to the second signal output, for example an input stage.

The first inductance and the second inductance may be provided as a common i.e. coupled inductance.

In particular, the coupled inductance may be a coil with a center tap, the center tap being coupled to the second electrostatic discharge element.

In the case of the integrated circuit arrangement, a third electrostatic discharge element may be provided between the second terminal, on the one hand, and the first and second inductances, on the other hand. Such an optional ESD protection element (for example a diode, a thyristor or a grounded n-MOS field effect transistor) can additionally improve the ESD protection.

The circuit arrangement is set up as a monolithically integrated circuit. Therefore, the circuit arrangement can be monolithically integrated in a substrate, for example in a semiconductor substrate, in particular in a silicon substrate (for example in a silicon chip). Therefore, the production of the circuit arrangement according to the invention can benefit from the advantages of mature silicon microtechnology, and the circuit arrangement can be provided in miniaturized size.

In the case of the integrated circuit arrangement, the first inductance and the second inductance may in each case be set up as (monolithically) integrated inductance. This measure means that the entire circuit arrangement can be provided in miniaturized fashion and be fabricated with minimal space requirement and thus cost-effectively.

A first signal output pad may be provided at the first signal output, and a second signal output pad may be provided at the second signal output.

Furthermore, in the case of the integrated circuit arrangement, the first inductance and the second inductance may be coupled in such a way that a coupling inductance (coupling factor k) is formed (mutual inductance). To put it another way, the first inductance and the second inductance are arranged spatially with respect to one another in such a way that these two components are functionally coupled to one another or can interact with one another in a certain way. By way of example, the two inductances may be provided in different but spatially sufficiently closely adjacent processing planes, so that they mutually influence each other with regard to their functionality. It is also possible, for coupling the inductances, to provide the latter as a coil with a center tap.

The integrated circuit arrangement may have a second capacitance and a third capacitance connected in series with the second capacitance, which capacitances are connected in parallel with the first capacitance, a node between the second capacitance and the third capacitance being coupled to the second electrostatic discharge element.

Furthermore, provision may be made of a fourth capacitance connected in parallel with the second electrostatic discharge element.

A fifth capacitance may be connected in parallel with the first electrostatic discharge element.

Furthermore, an RC element may be provided, that is to say a series circuit comprising a nonreactive resistor R and a capacitor C, which RC element is connected in parallel with the second electrostatic discharge element.

Moreover, provision may be made of a parallel circuit comprising a fourth electrostatic discharge element and a sixth capacitance, which parallel circuit is connected between the second terminal, on the one hand, and the first and second inductances, on the other hand.

By means of the provision of the RC element or the parallel circuit comprising the fourth electrostatic discharge element and the sixth capacitance, clearly an impedance setting is performed without degrading the protective effect of the circuit in the process.

Refinements of the circuit array according to the invention, which has an integrated circuit arrangement according to the invention, are described below. Refinements of the circuit array also apply to the integrated circuit arrangement and vice versa.

A useful circuit is understood to mean, in particular, a circuit which can be coupled to the circuit arrangement according to the invention or can be operated jointly with said circuit arrangement. At least one portion of the useful circuit can be connected to the signal outputs of the circuit arrangement according to the invention.

Such a circuit array contains the circuit arrangement according to the invention set up for the ESD protection, and additionally the useful circuit, which fulfils the actual functionality, in particular can process a radiofrequency signal in a predeterminable manner.

The useful circuit may have a GSM circuit (Global System for Mobile communications). GSM technology denotes a mobile radio standard that is principally used for telephony. GSM thus represents a standardized standard for digital mobile radio. As an alternative, the useful circuit may be a UMTS circuit (Universal Mobile Telecommunications System). UMTS is a mobile radio standard of a more recent generation and comprises enhanced multimedia services, satellites and ground-based transmitting stations. UMTS can be used to realize, by way of example, interhuman communication (audio and video telephony), message services (for example chats), information distribution (for example worldwide web browsing), enhanced position applications (personal navigation, driver assistance), business services (mobility in closed spaces) or mass services (for example banking services, e-commerce), etc.

The useful circuit may furthermore be realized as a WLAN circuit (Wireless Local Area Network).

The useful circuit may furthermore have a DCS circuit (Dynamic Channel Selection), a DECT circuit (Digital Enhanced Cordless Telecommunications), a Bluetooth circuit, a UWB circuit (Ultra Wide Band), a PCS circuit and/or a RADAR circuit.

For all these useful circuit applications, the solution according to the invention affords reliable protection against ESD and can thus contribute to improving the functionality of these useful circuits.

A description is given below, referring to FIG. 7, of an ESD protection circuit arrangement 700 in accordance with a first exemplary embodiment of the invention.

The ESD protection circuit arrangement 700 contains a first signal input pad 701 and a second signal input pad 702, between which a differential input signal can be applied. Furthermore, a first signal output 703 and a second signal output 704 are provided, between which a differential output signal is provided. The first signal output 703 is coupled to the first signal input pad 701, and the second signal output 704 is coupled to the second signal input pad 702. The signal outputs 703, 704 are coupled to an input stage circuit 705, that is to say to an arbitrary useful circuit in which the signals provided at the signal outputs 703, 704 are processed further. A first capacitance 706 is provided between the first signal input pad 701 and the second signal input pad 702. A first integrated inductance 707 and a second integrated inductance 708 are connected in series with one another and coupled to one another, which is symbolized by a coupling factor k 715 in FIG. 7. In other words, the integrated inductances 707, 708 interact with one another in order to form a coupling inductance. The series circuit comprising the first integrated inductance 707 and the second integrated inductance 708 is arranged between the first signal input pad 701 and the second signal input pad 702 and is connected in parallel with the first capacitance 706. The ground potential $V_{SS}$ is provided at a ground potential terminal 709. The supply potential $V_{DD}$ is provided at a supply potential terminal 710. A first ESD protection element 711 is connected up between the ground potential terminal 709 and the supply potential terminal 710. A second ESD protection element 712 is connected between the ground potential terminal and a potential node 714 between the first integrated inductance 707 and the second integrated inductance 708. Furthermore, a third ESD protection element 713 may optionally be connected between the supply potential terminal 710 and the node 714 in order to further improve the ESD protection.

Each of the ESD protection elements 711 to 713 may be formed for example as a diode, as a thyristor, as a grounded n-MOS field effect transistor or from an arbitrary interconnection of at least two such elements.

The ESD protection circuit arrangement 700 is set up for processing differential radiofrequency input signals and operates particularly effectively in a bandpass of frequencies. The two input pins 701, 702 are coupled to the mutually coupled coils 707, 708. The first capacitance 704 may be a parasitic capacitance or an explicit coupling capacitance, i.e. a capacitance component. The inductances 707, 708 and also the capacitance 706 are designed such that the two RF input pins 701, 702 remain insulated from one another with regard to a radiofrequency signal at the operating frequency of the ESD protection circuit arrangement 700.

Figure 7:
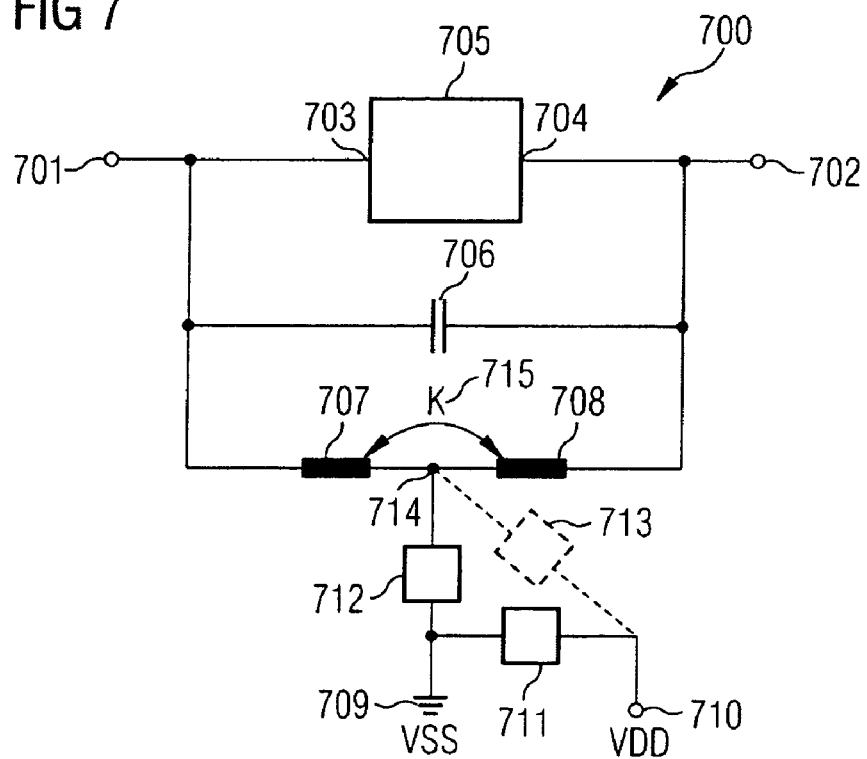
FIG. 7 shows an ESD protection circuit arrangement in accordance with a first exemplary embodiment of the invention.

On account of the interconnection in accordance with FIG. 7, an RF-free center node 714 is provided, to which additional ESD protection elements 711 to 713 are coupled without a harmful effect. The coil path realizes ESD protection in the case of ESD loading between the two input pins 701, 702. Furthermore, by means of additional ESD protection elements, an ESD protection is achieved in the case of the loading of one of the two input pins 701, 702 toward ground 709 or toward the positive supply voltage 710.

A description is given below, referring to FIG. 8, of an ESD protection circuit arrangement 800 in accordance with a second exemplary embodiment of the invention.

The ESD protection provided by means of the ESD protection circuit arrangement 800 is refined further relative to the ESD protection circuit arrangement 700 shown in FIG. 7.

FIG. 8 shows a concrete configuration for an input stage circuit 705. Such a circuit for the further processing of the signals provided at the signal outputs 703, 704 has, in accordance with the exemplary embodiment shown in FIG. 8, a first field effect transistor 801 and a second field effect transistor 802. A gate terminal of the first field effect transistor 801 is coupled to the first signal input pad 701, and a gate terminal of the second field effect transistor 802 is coupled to the second signal input pad 702. A current determined by the signals at the signal input pads 701, 702 flows between the source/drain terminals of the field effect transistors 801, 802.

Furthermore, the ESD protection circuit arrangement 800 contains a second capacitance 803 and a third capacitance 804, which are connected in parallel with the first capacitance 706, a potential node 714 between the second capacitance 803 and the third capacitance 804 being coupled to the second ESD protection element 712.

Furthermore, the ESD protection circuit arrangement 800 is provided with a fourth capacitance 805 connected in parallel with the second ESD protection element 712. A fifth capacitance 806 is connected in parallel with the first ESD protection element 711.

The second to fifth capacitances 803 to 806 may in each case again be realized as separate capacitor components or as parasitic capacitances.

The ESD protection circuit arrangement 800 with the additional ESD protection devices enables an ESD protection that is improved further relative to the ESD protection circuit arrangement 700, although the latter can be produced with a lower outlay.

A description is given below, referring to FIG. 9, of an ESD protection circuit arrangement 900 in accordance with a third exemplary embodiment of the invention.

The ESD protection circuit arrangement 900 is provided with additional means in comparison with the ESD protection circuit arrangement 800 in order to further improve the ESD protection.

Thus, the ESD protection circuit arrangement 900 contains an RC element 901 connected in parallel with the second ESD protection element 712. Furthermore, the ESD protection circuit arrangement 900 is provided with a parallel circuit comprising a fourth ESD protection element 902 and a sixth capacitance 903, which parallel circuit is connected between the supply potential terminal 710, on the one hand, and the node 714 on the other hand.

What is claimed is:

1. An integrated circuit arrangement comprising:
   a first signal input pad and a second signal input pad, to which a differential input signal can be applied;
   at least one signal output, at which an output signal can be provided, the signal output being coupled to the first signal input pad and to the second signal input pad;
   a first capacitance arranged between the first signal input pad and the second signal input pad;
   a first inductance and a second inductance connected in series with the first inductance, which inductances are arranged between the first signal input pad and the second signal input pad and are connected in parallel with the first capacitance;
   a first terminal having a first supply potential, and a second terminal having a second supply potential;
   a first electrostatic discharge element arranged between the first terminal and the second terminal; and
   a second electrostatic discharge element arranged between the first terminal, on the one hand, and the first and second inductances, on the other hand.

2. The integrated circuit arrangement as claimed in claim 1, wherein the first supply potential is an upper operating potential, and the second supply potential is a lower operating potential.

3. The integrated circuit arrangement as claimed in claim 1, wherein the first supply potential is a lower operating potential, and the second supply potential is a upper operating potential.

4. The integrated circuit arrangement as claimed in claim 1, wherein at least one of the electrostatic discharge elements has a diode.

5. The integrated circuit arrangement as claimed in claim 1, wherein at least one of the electrostatic discharge elements has a thyristor.

6. The integrated circuit arrangement as claimed in claim 1, wherein at least one of the electrostatic discharge elements has a field effect transistor.

7. The integrated circuit arrangement as claimed in claim 6, wherein the field effect transistor is a grounded n-MOS field effect transistor.

8. The integrated circuit arrangement as claimed in claim 1, wherein the differential input signal that can be applied to the first signal input pad and to the second signal input pad is a radio frequency signal.

9. The integrated circuit arrangement as claimed in claim 1, having a radiofrequency processing circuit connected to the signal output.

10. The integrated circuit arrangement as claimed in claim 1, wherein the signal output has a first signal output terminal and a second signal output terminal.

11. The integrated circuit arrangement as claimed in claim 10, further comprising a radiofrequency processing circuit connected to the first signal output terminal and to the second signal output terminal.

12. The integrated circuit arrangement as claimed in claim 1, wherein the first inductance and the second inductance are provided as coupled inductance.

13. The integrated circuit arrangement as claimed in claim 12, wherein the coupled inductance is a coil with a center tap coupled to the second electrostatic discharge element.

14. The integrated circuit arrangement as claimed in claim 1, further comprising a third electrostatic discharge element arranged between the second terminal, on the one hand, and the first and second inductances, on the other hand.

15. The integrated circuit arrangement as claimed in claim 1, wherein the first inductance and the second inductance are each set up as integrated inductance.

16. The integrated circuit arrangement as claimed in claim 1, further comprising a signal output pad is provided at the signal output.

17. The integrated circuit arrangement as claimed in claim 10, wherein a first signal output pad is provided at the first signal output terminal, and a second signal output pad is provided at the second signal output terminal.

18. The integrated circuit arrangement as claimed in claim 1, wherein the first inductance and the second inductance are coupled such that a coupling inductance is formed.

19. The integrated circuit arrangement as claimed in claim 14, further comprising a second capacitance and a third capacitance connected in series with the second capacitance, which capacitances are connected in parallel with the first capacitance, wherein a potential node arranged between the second capacitance and the third capacitance being coupled to the second electrostatic discharge element.

20. The integrated circuit arrangement as claimed in claim 19, further comprising a fourth capacitance connected in parallel with the second electrostatic discharge element.

21. The integrated circuit arrangement as claimed in claim 20, further comprising a fifth capacitance connected in parallel with the first electrostatic discharge element.

22. The integrated circuit arrangement as claimed in claim 1, further comprising an RC element connected in parallel with the second electrostatic discharge element.

23. The integrated circuit arrangement as claimed in claim 21, further comprising a parallel circuit comprising a fourth electrostatic discharge element and a sixth capacitance, which parallel circuit is connected between the second terminal, on the one hand, and the first and second inductances, on the other hand.

24. A circuit array, comprising:

an integrated circuit arrangement as claimed in claim 1; and a useful circuit coupled to the integrated circuit arrangement.

25. The circuit array as claimed in claim 24, wherein the useful circuit has a GSM circuit, a UMTS circuit, a WLAN circuit, a DCS circuit, a DECT circuit, a Bluetooth circuit, a UWB circuit, a PCS circuit, and/or a RADAR circuit.

* * * * *

UNITED STATES PATENT AND TRADEMARK OFFICE
CERTIFICATE OF CORRECTION

PATENT NO. : 7,388,734 B2  Page 1 of 1
APPLICATION NO. : 11/264294
DATED : June 17, 2008
INVENTOR(S) : Thomas Benetik et al.

It is certified that error appears in the above-identified patent and that said Letters Patent is hereby corrected as shown below:

Title Pg, Item (54) and Col. 1, Line 1, "CIRCIUT" should read --CIRCUIT--

Item (56) References Cited:

On page 2, under Other Publications, line 7 "Electronices" should read --Electronics--

In the Specification:

At column 3, line 10, "10.5essentially" should read --10.5 essentially --

At column 3, line 29, "CMOS-Technologyis" should read --CMOS-Technology" is--

In the Claims:

Column 11, in Claim 3, line 3, "a upper" should read --an upper--

Column 11, in Claim 8, line 20, "radio frequency" should read --radiofrequency--

Column 12, in Claim 25, line 43, "circuit,a" should read --circuit, a--

Signed and Sealed this

Sixteenth Day of September, 2008

JON W. DUDAS
*Director of the United States Patent and Trademark Office*